United States Patent [19]

Ishizeki

[11] Patent Number: 5,471,502
[45] Date of Patent: Nov. 28, 1995

[54] BIT CLOCK REGENERATION CIRCUIT FOR PCM DATA, IMPLEMENTABLE ON INTEGRATED CIRCUIT

[75] Inventor: Yoshiaki Ishizeki, Kanagawa, Japan

[73] Assignee: NEC Corporation, Tokyo, Japan

[21] Appl. No.: 243,707

[22] Filed: May 17, 1994

[30] Foreign Application Priority Data

May 17, 1993 [JP] Japan ..................... 5-113559

[51] Int. Cl.$^6$ .............. H03D 3/24; H03K 11/00
[52] U.S. Cl. .............. 375/376; 375/214; 375/215; 375/373
[58] Field of Search .............. 375/120, 4, 119, 375/110

[56] References Cited

U.S. PATENT DOCUMENTS

4,752,942  6/1988  Iwakami .................. 375/110
4,984,255  1/1991  Davis et al. .............. 375/110
5,208,839  5/1993  Hladik et al. ............ 375/110

*Primary Examiner*—Stephen Chin
*Assistant Examiner*—Huong Luu
*Attorney, Agent, or Firm*—Whitham, Curtis, Whitham & McGinn

[57] ABSTRACT

In a bit clock generation circuitry, a T/2 pulse generator includes a monostable multivibrator triggered by an edge of an input PCM data signal and controlled by a time constant adjusting signal so as to generate a pulse signal having its pulse width adjusted in accordance with the time constant adjusting signal. In response to a pulse signal generated by the monostable multivibrator, a D-type flipflop latches the input PCM data signal for generating a delayed data signal delayed from the input PCM data signal by T/2. An exclusive-OR means receives the input PCM data signal and the delayed data signal for generating a T/2 pulse signal.

8 Claims, 8 Drawing Sheets

BIT CLOCK REGENERATION CIRCUIT FOR PCM DATA, IMPLEMENTABLE ON INTEGRATED CIRCUIT

BACKGROUND OF THE INVENTION

1. Field of the Invention

The present invention relates to a bit clock regeneration circuit, and more specifically to a bit dock regeneration circuit for use in a receiver for PCM (pulse code modulation) data and the like.

2. Description of Related Art

Figure 1A:
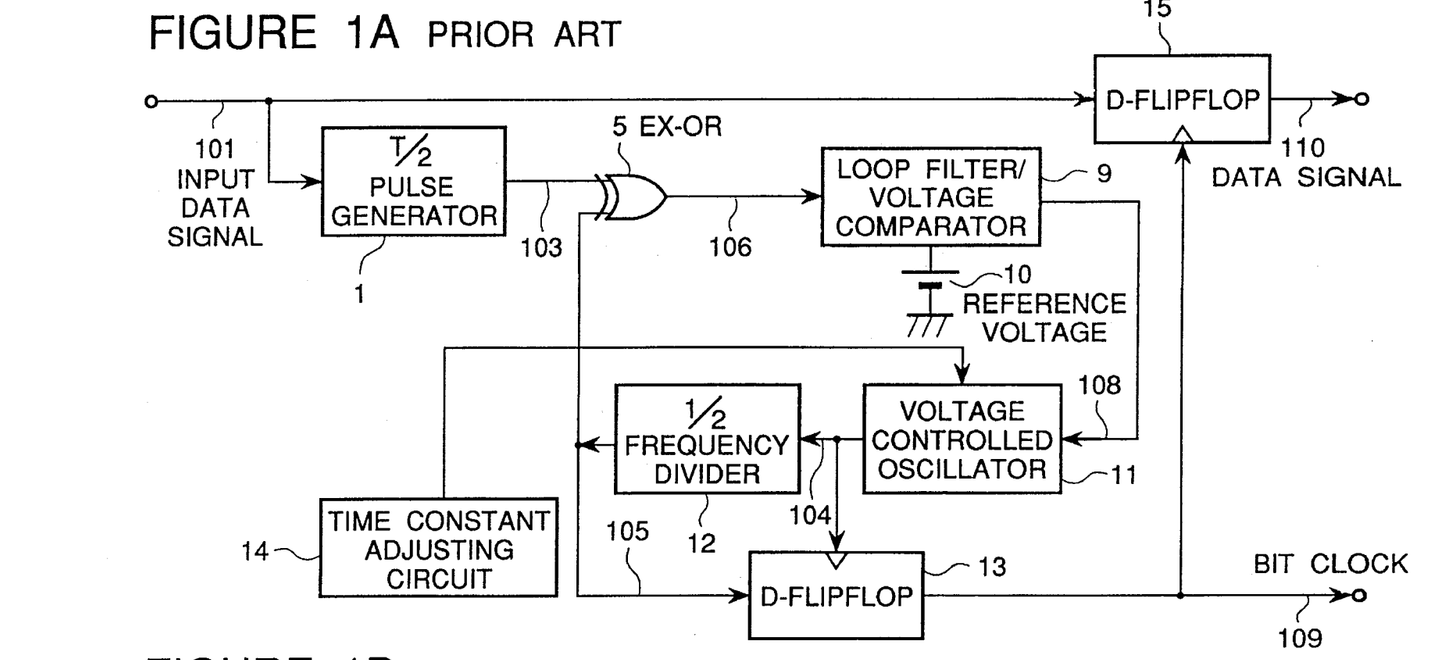
FIG. 1A is a block diagram illustrating a typical conventional bit clock regeneration circuit for use in a PCM data receiver.

Referring to FIG. 1A, there is shown a typical example of a conventional bit clock regeneration circuit, which can be used in a receiver for PCM data or the like, for the purpose of regenerating a bit clock from an asynchronous input data so that the input data can be decoded on the basis of the regenerated bit clock. The shown bit flock regeneration circuit includes a T/2 pulse generator 1, an exclusive-OR circuit 5, a loop filter and voltage comparator 9, a reference voltage 10, a voltage controlled oscillator 11, a ½ frequency divider (divided-by-two frequency divider) 12, D-type flip-flops 13 and 15, and a time constant adjusting circuit 14, which are connected as shown in FIG. 1A.

Figure 1B:
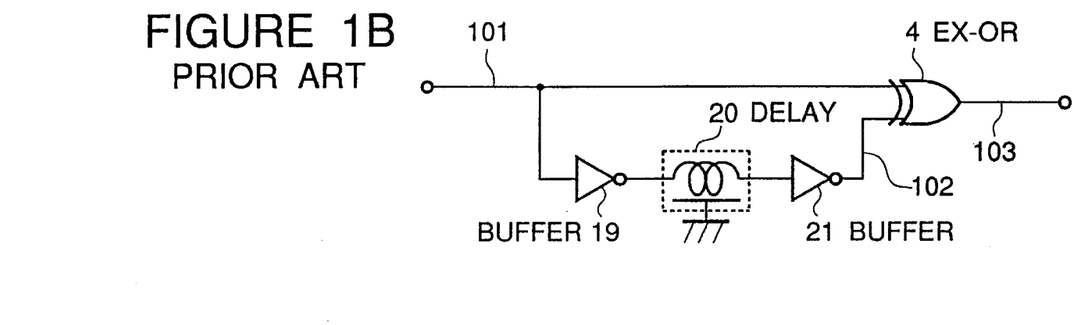
FIG. 1B is a logic circuit diagram illustrating a circuit construction of the T/2 pulse generator used in the bit clock regeneration circuit shown in FIG. 1A.

For example, as shown in FIG. 1B, the T/2 pulse generator 1 includes an exclusive-OR circuit 4 having a first input directly receiving an input data signal 101, a buffer 19 in the form of an inverter also receiving the input data signal 101, and another buffer 21 in the form of an inverter receiving an output of the buffer 19 through a delay circuit 20, an output of the buffer 21 being connected to a second input of the exclusive-OR circuit 4.

Figure 2:
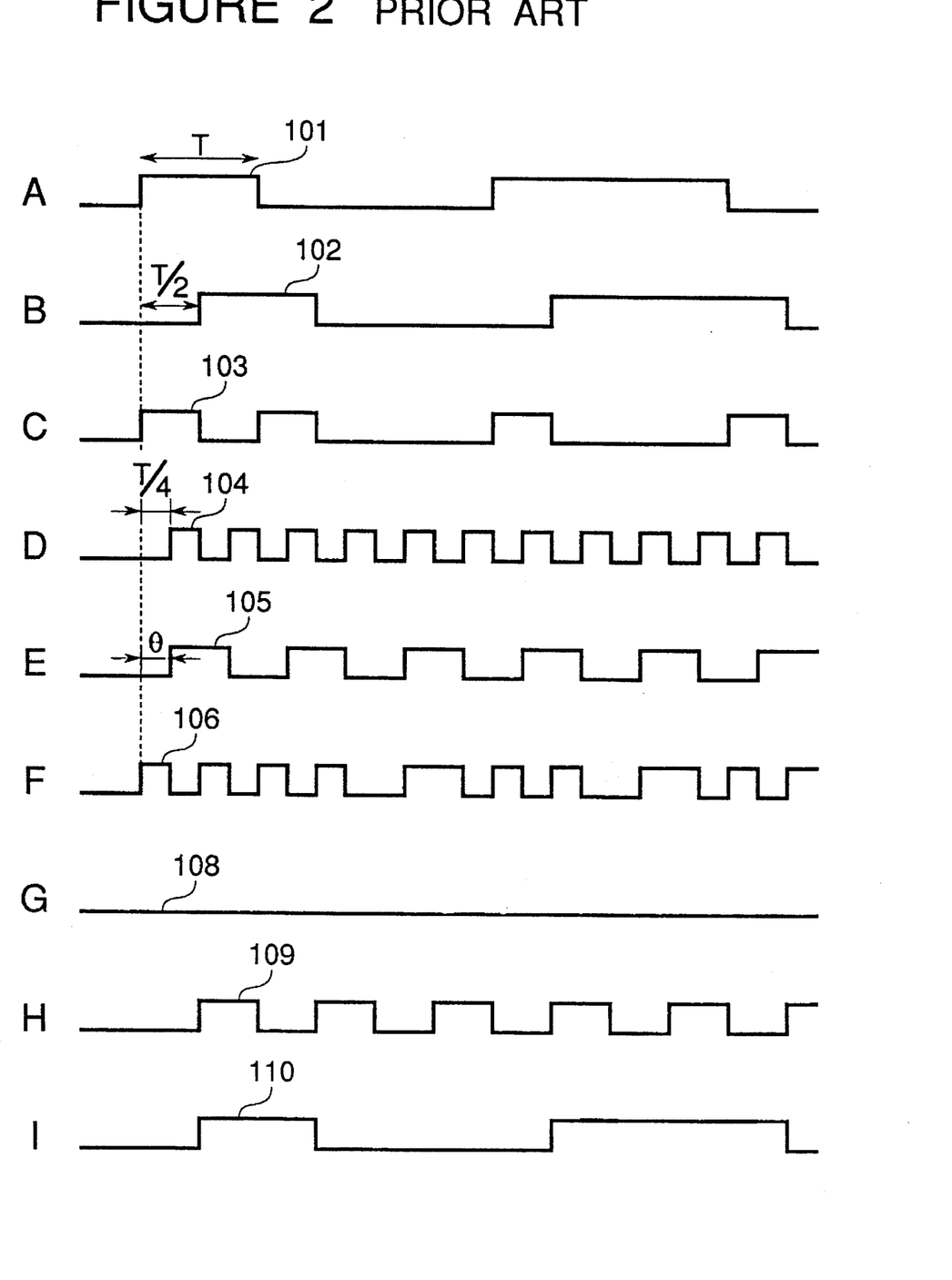
FIGS. 2, 3 and 4 are timing charts for illustrating an operation of the circuit shown in FIG. 1A, in which each of the waveforms designated by the three-digit Reference Numerals depicts a change of the signal appearing on a point designated by the same Reference Numeral in FIG. 1A.
Figure 3:
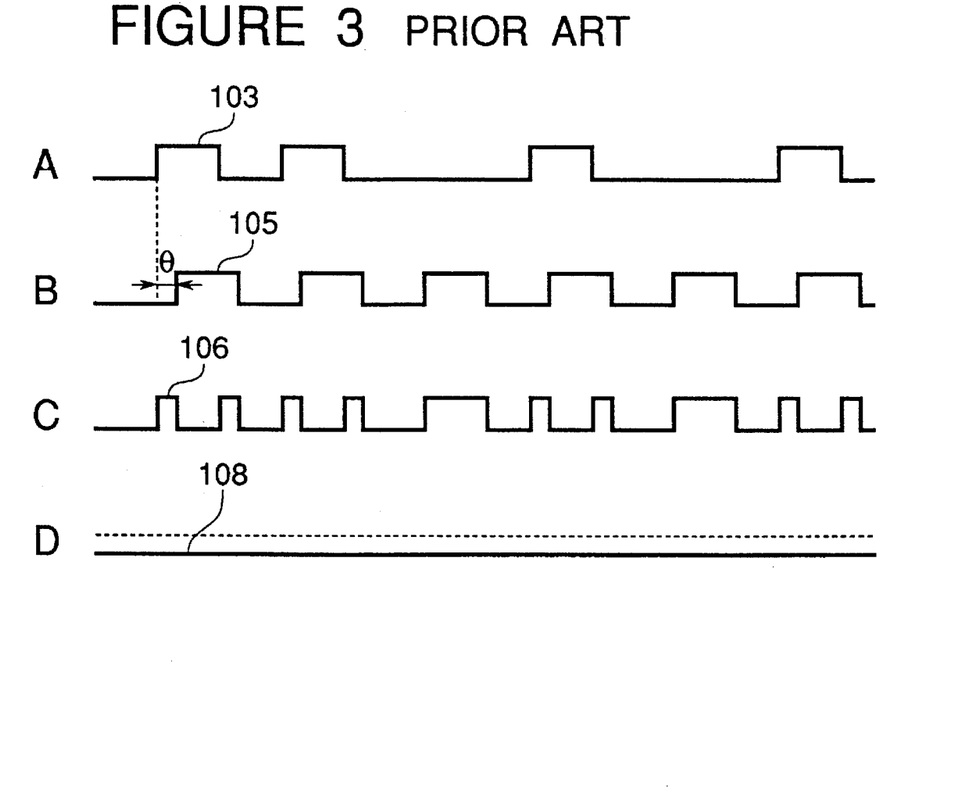
Figure 4:
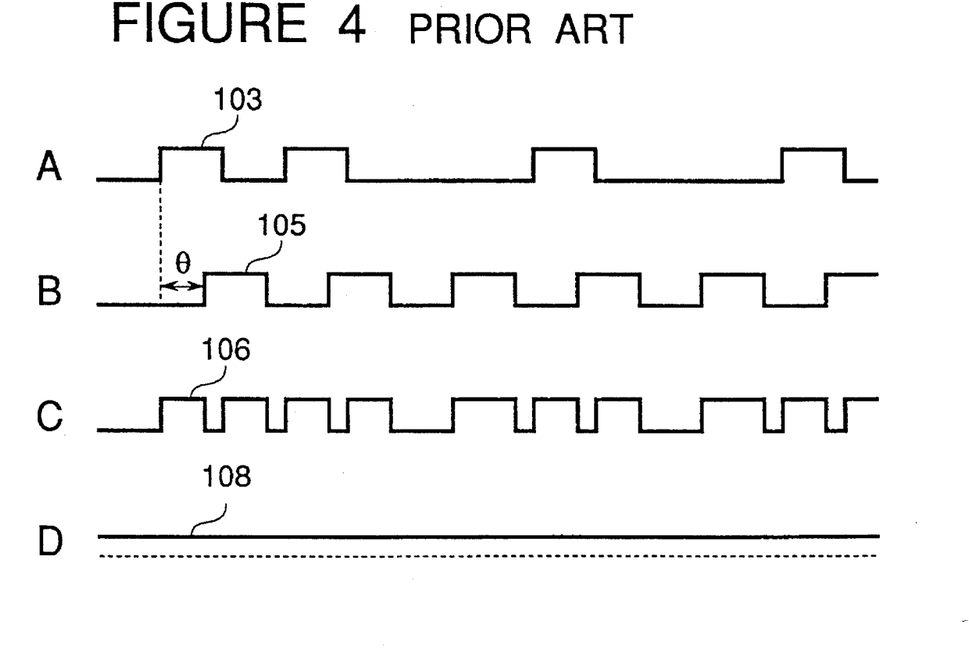

FIGS. 2, 3 and 4 are timing charts for illustrating an operation of the circuit shown in FIG. 1A. In FIGS. 2, 3 and 4, each of waveforms designated by the three-digit Reference Numerals depicts a change of the signal appearing on a point designated by the same Reference Numeral in FIG. 1A.

As seen from FIG. 1A, the input data signal 101 as shown at A in FIG. 2 is supplied to the T/2 pulse generator 1 and a data input of the D-type flipflop 15. In the T/2 pulse generator 1, as will be understood from FIG. 1B, the input data signal 101 is delayed by one half of a minimum pulse width T of the input data signal 101, by action of the buffers 19 and 21 and the delay circuit 20, so that a delayed input data signal 102 is generated as shown at B in FIG. 2. As a result, the exclusive-OR circuit 4 and hence the T/2 pulse generator 1 generates a pulse 103 which rises up at both a rising edge and a falling edge of the input data signal 101, as shown at C in FIG. 2. This pulse 103 is applied to one input of the exclusive-OR circuit 5.

On the other hand, the voltage controlled oscillator 11 generates an oscillation output signal 104 having a frequency (2/T) that is double that of the frequency corresponding to a reciprocal of the minimum pulse width T, as shown at D in FIG. 2. This oscillation output signal 104 is supplied to a ½ frequency divider 12, which in turn generates a frequency divided signal 105 having the frequency (1/T) corresponding to the reciprocal of the minimum pulse width T, as shown at E in FIG. 2. This frequency divided signal 105 is supplied to another input of the exclusive-OR circuit 5.

Thus, the exclusive-OR circuit 5 compares the pulse signal 103 with the pulse signal 105 in phase, and generates a pulse signal 106 indicative of a phase difference (θ), as shown at F in FIG. 2. This pulse signal 106 is supplied to the loop filter and voltage comparator 9, in which the pulse signal 106 is smoothened so as to generate a mean voltage signal in proportion to the phase difference, and the mean voltage signal is compared with the reference voltage 10 so as to generate a comparison result voltage signal 108 as shown at G in FIG. 2. This comparison result voltage signal 108 is applied to a control input of the voltage controlled oscillator 11 so as to control the oscillation frequency of the voltage controlled oscillator 11. Incidentally, the time constant of the voltage controlled oscillator 11 is controlled by the time constant adjusting circuit 14.

Thus, by action of the above mentioned phase synchronizing system, the oscillation frequency of the voltage controlled oscillator 11 is controlled to always follow the rate of the input data signal 101.

As seen from the above description, the above mentioned phase synchronizing system is such that the edge of the input data signal 101 is detected for the phase comparison. Accordingly, if the rate of the input data signal 101 is slow in relation to the frequency-divided signal 105 outputted from the ½ frequency-divider 12, as shown at A and B in FIG. 3, the pulse width in the output 106 of the exclusive-OR circuit 5 becomes narrow as shown at C in FIG. 3, so that the comparison result voltage signal 108 between the mean voltage signal in proportion to the phase difference and the reference voltage 10 is apt to relatively decrease its level as shown at D in FIG. 3.

On the other hand, if the rate of the input data signal 101 is fast in relation to the frequency-divided signal 105 outputted from the ½ frequency-divider 12, as shown at A and B in FIG. 4, the pulse width in the output 106 of the exclusive-OR circuit 5 becomes wide as shown at C in FIG. 4, so that the comparison result voltage signal 108 between the mean voltage signal in proportion to the phase difference and the reference voltage 10 is apt to relatively increase its level as shown at D in FIG. 4.

The oscillation output signal 104 is also supplied to a latch timing input of the D-type flipflop 13, whose data input is connected to receive the frequency-divided signal 105, so that the frequency-divided signal 105 is latched in synchronism with each falling edge of the oscillation output signal 104. Accordingly, the D-type flipflop 13 generates a bit clock 109 as shown at H in FIG. 2, which has the same frequency as that of the frequency-divided signal 105 but is delayed in phase by T/4.

The bit clock 109 is supplied to a latch timing input of the D-type flipflop 15, which receives at its data input the input data signal 101 as mentioned above. The input data signal 101 is latched in the D-type flipflop 15 at an intermediate portion of the input data signal 101 in synchronism with the rising edge of the bit clock 109, so that the D-type flipflop 15 generates a data signal 110, at I in FIG. 2. Thus, the input data signal 101 having variations caused by noise, jitter, etc. is convened to the data signal 110 having a minimized error rate.

In the above mentioned conventional bit clock regeneration circuit, it is practically difficult to cause the T/2 pulse generator 1 to generate a precise and stable T/2 pulse 103 on the basis of the input data signal 101 being supplied asynchronously.

As mentioned above, the conventional T/2 pulse generator 1 is composed of the buffers 19 and 21 in the form of an inverter, the delay circuit 20 giving a delay time of T/2, and the exclusive-OR circuit 4 as shown in FIG. 1B. Efforts have been paid to precisely generate the T/2 pulse. However, the delay circuit 20 is a discrete component, which cannot be implemented on an LSI (large-scale integrated circuit) chip. Furthermore, the delay circuit 20 is extremely expensive in comparison with the cost of the other functional units, and is too large in occupancy area and volume in view of a demand for miniaturization of devices. Accordingly, the discrete delay circuit is not preferable in practice.

On the other hand, in order to ensure that the input data signal 101 is latched in the D-type flipflop 15 at a precisely center position of the input data signal, there is required the bit clock 109 obtained by delaying the output 105 of the ½ frequency-divider 12 accurately by T/2. For this purpose, the duty ratio of the output 104 of the voltage controlled oscillator 11 is required to be made 50% to the utmost. However, this is difficult in the conventional circuit structure.

SUMMARY OF THE INVENTION

Accordingly, it is an object of the present invention to provide a bit clock regeneration circuit which has overcome the above mentioned defect of the conventional one.

Another object of the present invention is to provide a bit clock regeneration circuit unnecessary to use the conventional delay circuit which was extremely expensive in comparison with the cost of the other functional units and which was too large in occupancy area and volume in view of a demand for miniaturization of devices.

Still another object of the present invention is to provide a bit clock regeneration circuit which is precise and so small that it can be easily implemented on the LSI chip.

A further object of the present invention is to provide a bit clock regeneration circuit having a voltage controlled oscillator capable of generating an oscillation output having a duty ratio of precisely 50%, so that an input data signal can be latched precisely at its center in phase.

The above and other objects of the present invention are achieved in accordance with the present invention by a bit clock regeneration circuit comprising:

a T/2 pulse generator receiving an input PCM data signal having a minimum pulse width T, for generating a T/2 pulse signal having a pulse width corresponding to one half of the minimum pulse width T, the T/2 pulse generator including an edge triggered flipflop circuit responding to the input PCM data signal for outputting a pulse having its pulse width adjusted by a time constant adjusting signal;

a voltage controlled oscillator having a reference oscillation frequency corresponding to 2/T, and controlled by a frequency control signal so as to change its oscillation frequency on the basis of a voltage of the frequency control signal;

a ½ frequency divider receiving an output of the voltage controlled oscillator, for generating a frequency divided signal having its frequency which is one haft of the oscillation frequency of the voltage controlled oscillator;

a phase comparator receiving the T/2 pulse signal and the frequency divided signal, for generating a phase comparison pulse signal indicative of a phase difference between the T/2 pulse signal and the frequency divided signal, a filter and comparison means receiving the phase comparison pulse signal, for generating a mean voltage indicative of the phase difference between the T/2 pulse signal and the frequency divided signal, and comparing the mean voltage with a reference voltage so as to generate a voltage different signal as the frequency control signal to the voltage controlled oscillator;

a first latch means latching the frequency divided signal in response to the output of the voltage controlled oscillator so as to generate a bit clock that is delayed from the frequency divided signal by T/4; and a second latch means latching the input PCM data signal in response to the bit clock so as to generate a data signal.

In a preferred embodiment, the T/2 pulse generator includes a monostable means triggered by an edge of the input PCM data signal and controlled by the time constant adjusting signal so as to generate a pulse signal having its pulse width adjusted in accordance with the time constant adjusting signal, a third latch means latching the input PCM data signal in response to the pulse signal generated by the monostable means, for generate a delayed data signal delayed from the input PCM data signal by T/2, and an exclusive-OR means receiving the input PCM data signal and the delayed data signal for generating the above mentioned T/2 pulse signal.

The above and other objects, features and advantages of the present invention will be apparent from the following description of preferred embodiments of the invention with reference to the accompanying drawings.

DESCRIPTION OF THE PREFERRED EMBODIMENTS

Figure 5:
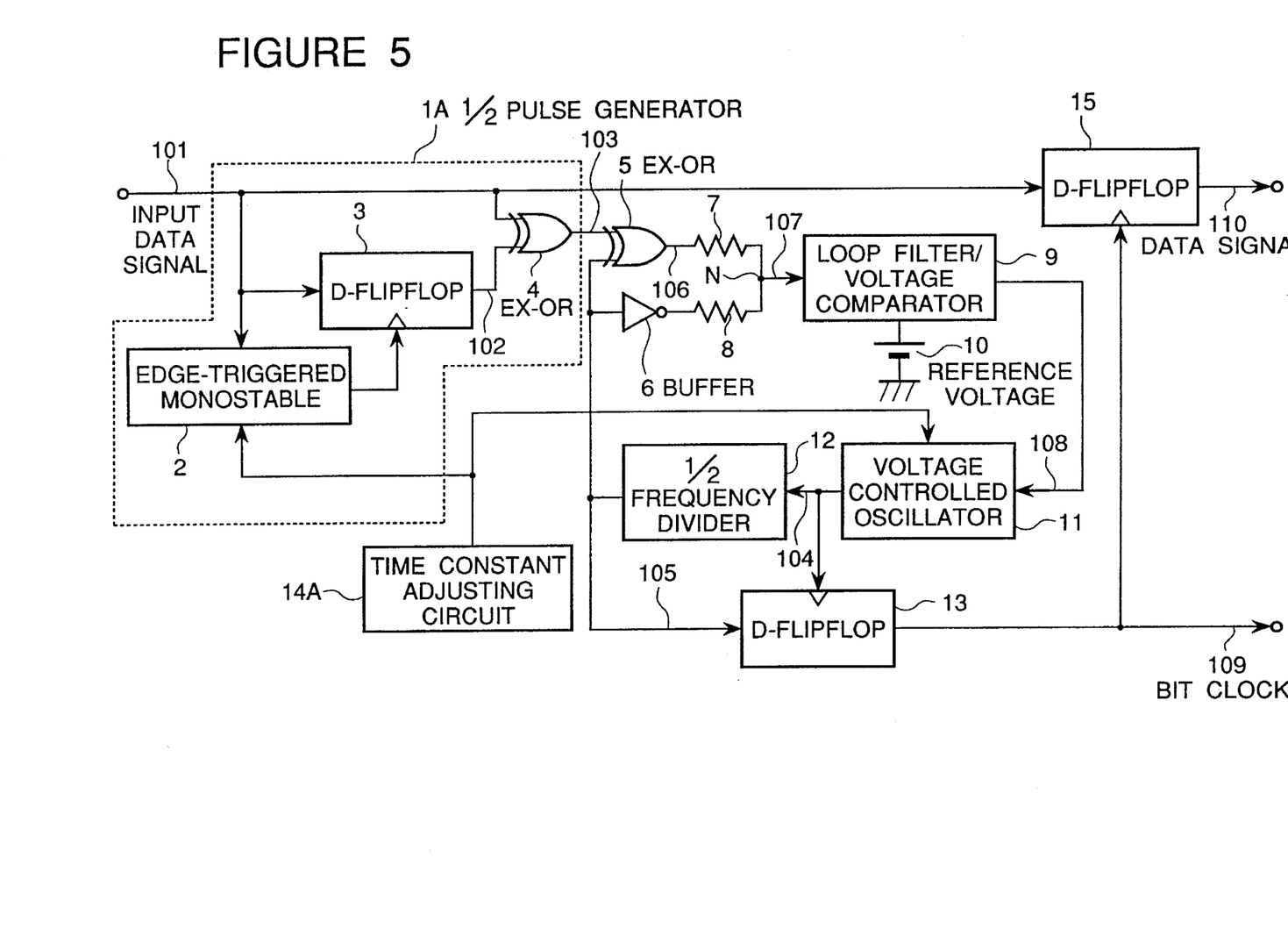
FIG. 5 is a block diagram illustrating one embodiment of the bit clock regeneration circuit in accordance with the present invention.

Referring to FIG. 5, there is shown a block diagram illustrating one embodiment of the bit clock regeneration circuit in accordance with the present invention. In FIG. 5, elements corresponding in function to those shown in FIG. 1A are given the same Reference Numerals.

The shown embodiment includes a ½ pulse generator 1A, which includes an edge triggered monostable multivibrator 2 receiving an input PCM data signal 101 (having a minimum pulse width T) and having its time constant controlled by a time constant adjusting circuit 14A, so as to generate a pulse signal having its pulse width corresponding to the controlled time constant, a D-type flipflop 3 latching the input PCM data signal 101 in response to a pulse signal generated by the monostable multivibrator 2, for generating a delayed data signal 102 delayed from the input PCM data signal by T/2. The input PCM data signal and the delayed data signal are supplied to an exclusive-OR circuit 4, which generates a T/2 delayed pulse signal 103.

This T/2 delayed pulse signal 103 is supplied to one input of another exclusive-OR circuit 5, which has an output connected through a resistor 7 to a node N. This node is connected to an input of a loop filter and voltage comparator 9 associated with a reference voltage 10. An output 108 of the loop filter and voltage comparator 9 is connected to a frequency control input of a voltage controlled oscillator 11, which has a time constant control input connected to the time constant adjusting circuit 14A. An output 104 of the voltage controlled oscillator 11 is connected to an input of a ½ frequency divider 12, which in turn has an output connected to a second input of the exclusive-OR circuit 5 and an input of a buffer 106 in the form of an inverter. An output of the inverter 106 is connected through a resistor 8 to the node N.

Furthermore, the output of the ½ frequency divider 12 is connected to a data input of a D-type flipflop 13, which has its latch control input connected to the output 104 of the voltage controlled oscillator 11. The D-type flipflop 13 generates a bit clock 109 at its output, which is connected to a latch control input of the D-type flipflop 15. The D-type flipflop 15 has its data input connected to receive the input data signal 101, and generates a data signal 110 at its output.

Now, the shown embodiment will be explained in more detail with reference to FIGS. 6, 7 and 8 in which each of waveforms designated by the three-digit Reference Numerals depicts a change of the signal appearing on a point designated by the same Reference Numeral in FIG. 5.

Figure 6:
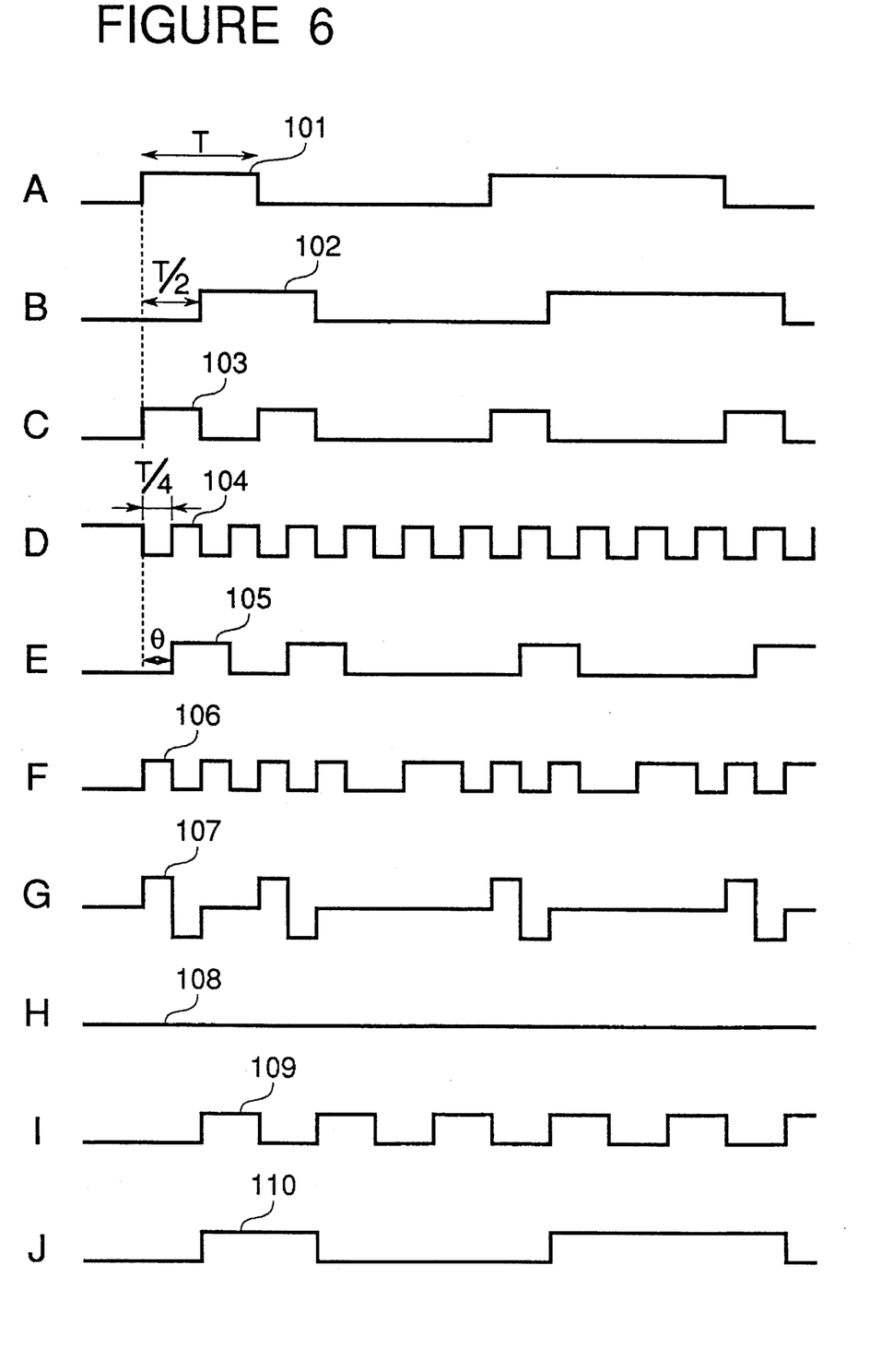
FIGS. 6, 7 and 8 are timing charts for illustrating an operation of the circuit shown in FIG. 5, in which each of the waveforms designated by the three-digit Reference Numerals depicts a change of the signal appearing on a point designated by the same Reference Numeral in FIG. 5.

The asynchronous input PCM data signal 101, as shown at A in FIG. 6, is regenerated for example from a recording medium such as a magnetic tape or a communication channel. The asynchronous input PCM data signal 101 is supplied to the edge triggered monostable multivibrator 2, the D-type flipflop 3 and the exclusive-OR gate 4 included in the ½ pulse generator 1A, and also to the D-type flipflop 15.

The monostable multivibrator 2 generates a time signal corresponding to one half of the minimum pulse width T of the input data signal 101, and the time signal is applied to the D-type flipflop 3 as a latching clock. Therefore, the D-type flipflop 3 latches the input data signal 101 in response to the time signal generated by the monostable multivibrator 2, and generates the T/2-delayed pulse 102 as shown at B in FIG. 6, which is supplied to the second input of the exclusive-OR circuit 4. Accordingly, the exclusive-OR circuit 4 phase-compares the input data signal 101 with the output 102 of the D-type flipflop 3, and generates a pulse signal 103 indicative of a phase difference. This pulse 103 is applied to one input of the exclusive-OR circuit 5.

On the other hand, the voltage controlled oscillator 11 generates an oscillation output signal 104 having a frequency (2/T) that is a double of the frequency corresponding to a reciprocal of the minimum pulse width T, as shown at D in FIG. 6. This oscillation output signal 104 is supplied to the ½ frequency divider 12, which in turn generates a frequency divided signal 105 having the frequency (1/T) corresponding to a reciprocal of the minimum pulse width T, as shown at E in FIG. 6. This frequency divided signal 105 is supplied to another input of the exclusive-OR circuit 5 and the buffer 6.

Thus, the exclusive-OR circuit 5 compares the pulse signal 103 with the pulse signal 105 in phase, and generates a pulse signal 106 indicative of the phase difference (θ), as shown at F in FIG. 6. This pulse signal 106 is supplied through the resistor 7 and the node N to the loop filter and voltage comparator 9. The pulse signal 105 is also supplied to the buffer circuit 6 and the resistor 8 and the node N to the loop filter and voltage comparator 9. These resistors 7 and 8 and the buffer 6 are provided for the purpose of minimizing the jitter and the like so as to elevate the quality of the regenerated bit clock. In the case that the output of the exclusive-OR circuit 5 is a voltage output, the resistors 7 and 8 have the same resistance value. In view of an operation of the system, the resistor 7 can be short-circuited, and the resistor 8 and the buffer 6 can be removed so that only the output of the exclusive-OR circuit 5 is connected directly to the loop filter and voltage comparator 9. Alternatively, in the case that the output of the exclusive-OR circuit 5 is a current output, both of the resistors 7 and 8 can be short-circuited, and in view of an operation of the system, no problem occurs even if the resistor 8 and the buffer 6 are removed.

With the circuit construction as shown in FIG. 5, a signal 107 as shown at G in FIG. 6 appears at the node N, and applied to the loop filter and voltage comparator 9, in which the signal 107 is smoothened so as to generate a mean voltage signal in proportion to the phase difference, and the mean voltage signal is compared with the reference voltage 10 so as to generate a comparison result voltage signal 108 as shown at H in FIG. 6. This comparison result voltage signal 108 is applied to the frequency control input of the voltage controlled oscillator 11 so as to control the oscillation frequency of the voltage controlled oscillator 11.

Thus, by action of the above mentioned phase synchronizing system, the oscillation frequency of the voltage controlled oscillator 11 is controlled to always follow the rate of the input data signal 101.

The oscillation output signal 104 of the voltage controlled oscillator 11 is also supplied to a latch timing input of the D-type flipflop 13, whose data input is connected to receive the frequency-divided signal 105, so that the frequency-divided signal 105 is latched in synchronism with each falling edge of the oscillation output signal 104. Accordingly, the D-type flipflop 13 generates a bit dock 109 as shown at I in FIG. 6, which has the same frequency as that of the frequency-divided signal 105 but is delayed in phase by T/4.

The bit clock 109 is supplied to a latch timing input of the D-type flipflop 15, which receives at its data input the input data signal 101 as mentioned above. The input data signal 101 is latched in the D-type flipflop 15 at an intermediate portion of a phase of the input data signal 101 in synchronism with the rising edge of the bit clock 109, so that the D-type flipflop 15 generates a data signal 110, shown at I in FIG. 2. The above mentioned edge triggered multivibrator 2 and the voltage controlled oscillator 11 are configured so that the time constant and the initial adjustment of the frequency are set and controlled by one time constant adjusting circuit 14.

Now, as one example of an emitter coupled multivibrator having the duty ratio of 50%, a relation between the edge triggered monostable multivibrator 2 and the voltage controlled oscillator 11 will be described with reference to FIG. 9.

Figure 9:
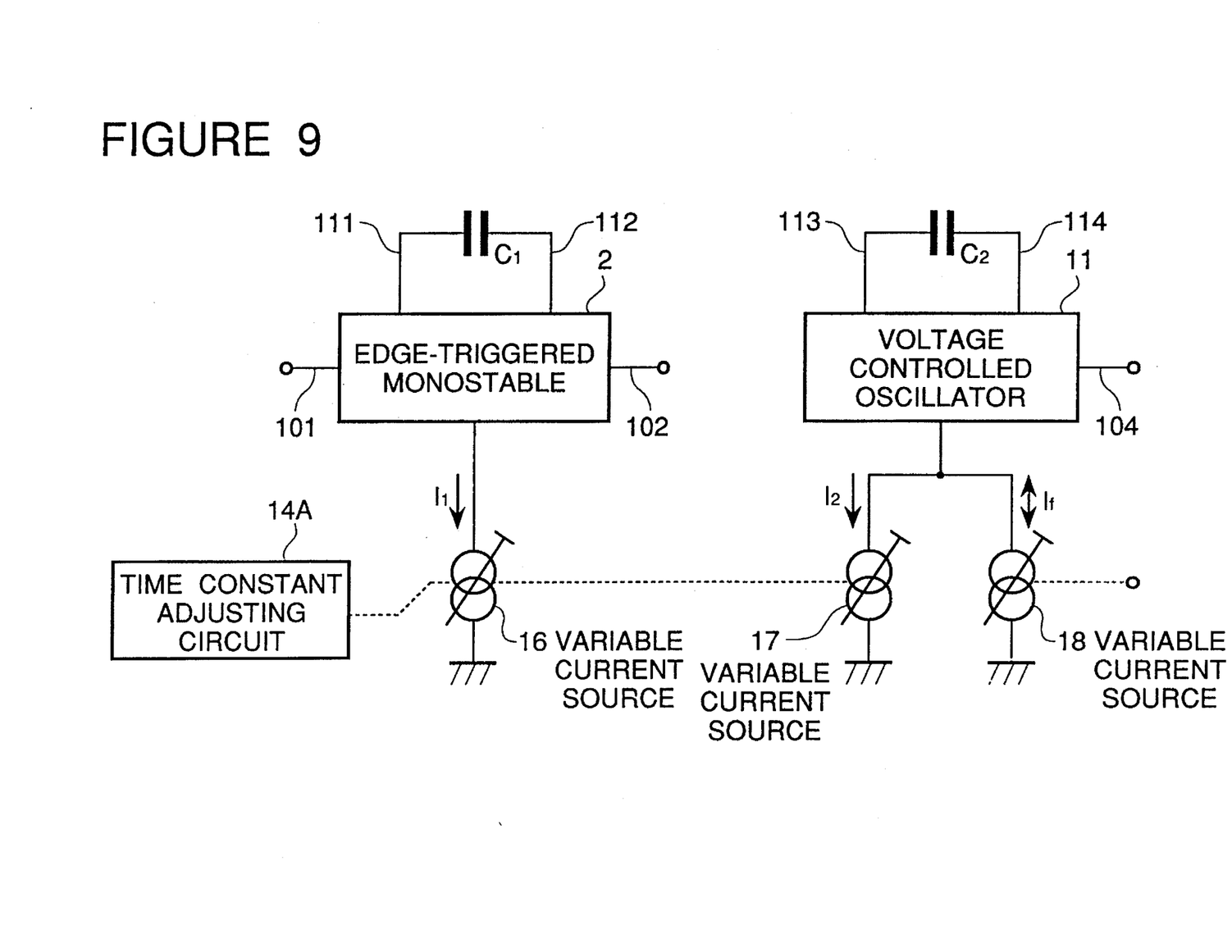
FIG. 9 is a conceptual diagram illustrating the relation between the monostable multivibrator and the voltage controlled oscillator.

Since the edge triggered monostable multivibrator 2 and the voltage controlled oscillator 11 have fundamentally the same construction, each of the edge triggered monostable multivibrator 2 and the voltage controlled oscillator 11 is simply depicted by a single block in FIG. 9. The only difference between the voltage controlled oscillator 11 and the edge triggered monostable multivibrator 2 is that, in the voltage controlled oscillator 11, an output signal 104 corresponding to the output signal 102 of the edge triggered monostable multivibrator 2 is inverted and then supplied to an input corresponding to the data input signal 101 of the edge triggered monostable multivibrator 2, so that a free running oscillator is constituted. In order to determine the time constant, the edge triggered monostable multivibrator 2 is associated with a capacitor $C_1$ and connected to a variable current source 16, and the voltage controlled oscillator 11 is associated with a capacitor $C_2$ and connected to variable current sources 17 and 18 connected in parallel.

The oscillation frequency of the voltage controlled oscillator 11 is determined by a capacitance $C_2$ and a current $I_2$ when a frequency adjusting current $I_f$ adjusted by a variable current source 18 is ±0. In addition, the voltage controlled oscillator 11 is adjusted by the time constant adjusting circuit 14A so that the oscillation frequency has a wavelength corresponding to one half of the minimum pulse width T of the input data signal.

Incidentally, the variable current sources 16 and 17 are adjusted by the time constant adjusting circuit 14A, and the variable current source 18 is adjusted by the output 108 of the loop filter and voltage comparator 9.

Figure 10:
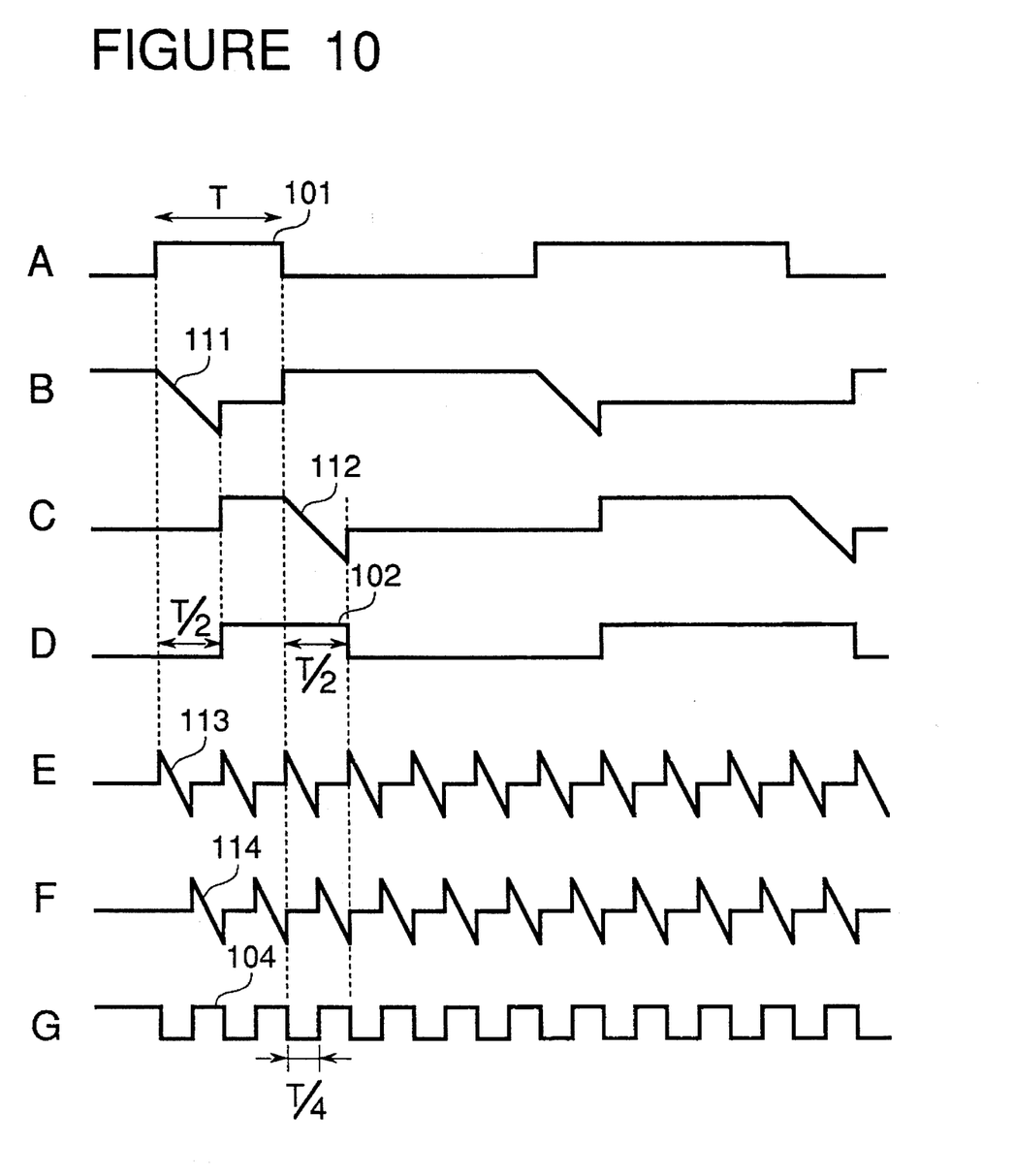
FIG. 10 is a timing chart illustrating the operation of the monostable multivibrator and the voltage controlled oscillator.

At this time, if the time constant of the edge triggered monostable multivibrator 2 is previously adjusted to fulfill the relation of $C_2 \times I_2$: $C_1 \times I_1 = 1:2$ by controlling for example two variable current sources 16 and 17, the signals as shown in FIG. 10 can be obtained by only adjusting the free running frequency similarly to the conventional voltage controlled oscillator 11. In FIG. 10, each of waveforms designated by the three-digit Reference Numerals depicts a change of the signal appearing on a point designated by the same Reference Numeral in FIG. 9. Thus, the edge triggered monostable multivibrator 2 can generate the signal 102 which is in synchronism with the rising edge of the input data signal 101 but is precisely delayed from the input data signal 101 by T/2, and on the other hand, the voltage controlled oscillator 11 generates the oscillation output having one half-wave length corresponding to T/4 when a frequency adjusting current $I_f$ adjusted by a variable current source 18 is ±0.

Thus, the circuit construction shown in FIG. 5 makes it possible to realize the ½ pulse generator without a delay circuit which is an expensive external part.

Now, operation of the shown embodiment will be explained with reference to FIG. 6. In the circuit shown in FIG. 5, now assume that the time constant of the edge triggered monostable multivibrator 2 has been already adjusted to correspond to one half of the minimum pulse width T of the input data signal 101 when the free running frequency of the voltage controlled oscillator 11 is adjusted. In this case, the edge triggered monostable multivibrator 2 responds to the rising edge of the input data signal 101 and generates a clock at a time period of T/2. In response to each generated clock, the D-type flipflop 3 latches the input data signal 101 so as to output the data signal 102 delayed in phase from the input data signal 101 by T/2.

This delayed data signal 102 is supplied together with the input data signal 101 to the exclusive-OR circuit 4, which generates a T/2 pulse 103 having a rising edge in synchronism with the rising edge of the input data signal 101. This T/2 pulse 103 is supplied to the first input of the exclusive-OR gate 5.

On the other hand, the oscillation output 104 of the voltage controlled oscillator 11 having the free running frequency corresponding to a reciprocal of one half of the minimum pulse width T of the input data signal 101, is supplied to the ½ frequency-divider 12, and the output 105 of the ½ frequency-divider 12 is supplied to the second input of the exclusive-OR gate 5, so that it is compared with the T/2 pulse 103. The exclusive-OR gate 5 generates the pulse signal 106 indicative of the phase difference (θ).

Even if this pulse signal 106 indicative of the phase difference is directly supplied to the loop filter and voltage comparator 9, the mean value voltage for controlling the voltage controlled oscillator 11 does not change. In the shown embodiment, however, since the output component 105 of the ½ frequency-divider 12 is cancelled from the pulse signal 106 indicative of the phase difference, a pure phase comparison result signal 107 is obtained. If the phase synchronizing system is in a proper synchronous condition as shown at A, D and E in FIG. 6, the difference θ in phase between the rising edge of the input data signal 101 and the rising edge of the output 105 of the ½ frequency-divider 12 becomes T/4, and respective existence probabilities of a high level "H" and a low level "L" become the same in the phase comparison result output 107 (or 106). Accordingly, the mean value voltage obtained by smoothing the phase comparison result output 107 (or 106) by a loop filter included in the loop filter and voltage comparator 9 becomes equal to the reference voltage 10. Therefore, the output of the voltage comparison result becomes 0 (zero), so that the oscillation frequency of the voltage controlled oscillator 11 does not change.

Figure 7:
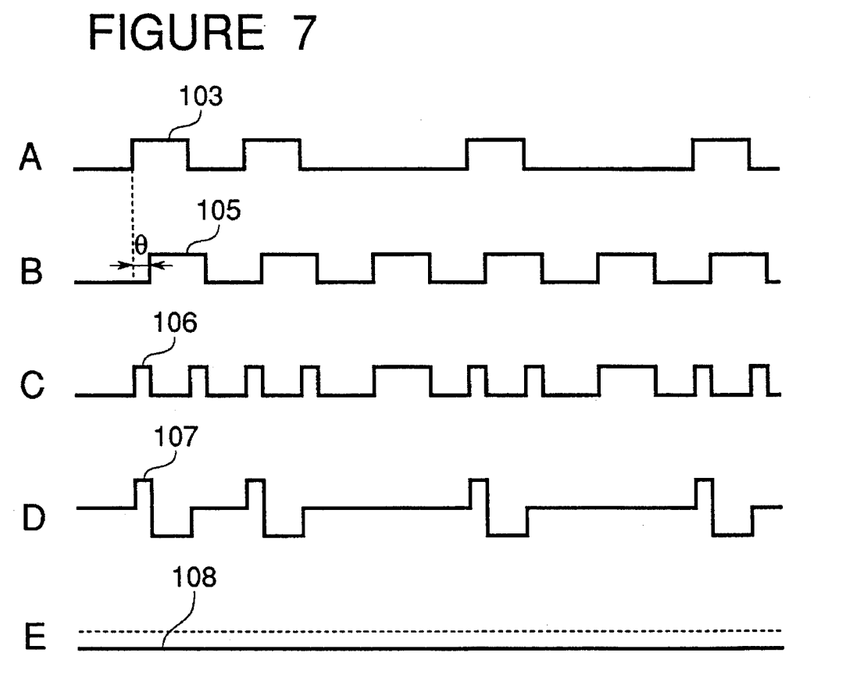
Figure 8:
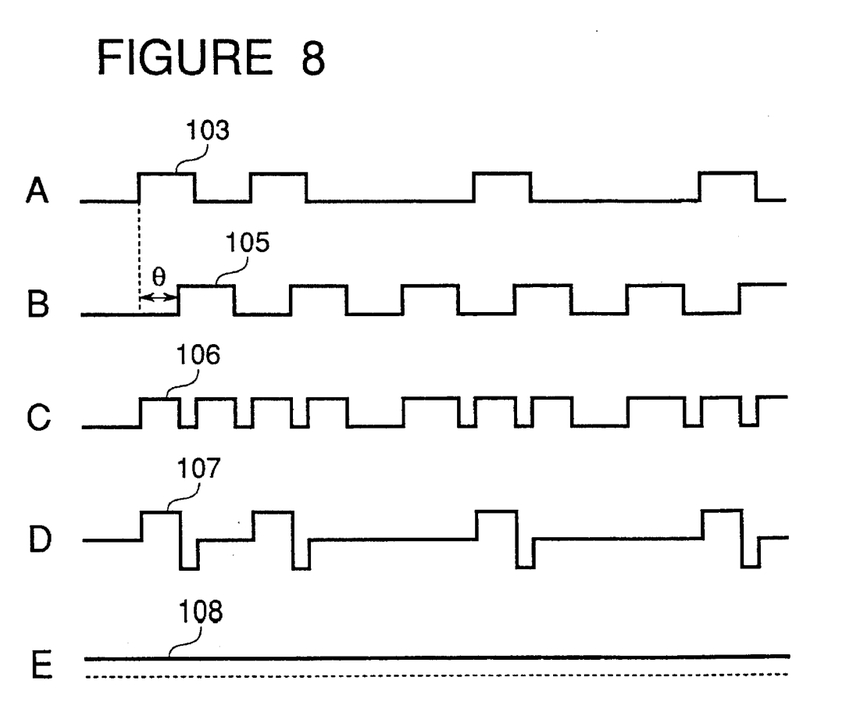

If the input data signal 101 becomes delayed as shown in FIG. 7, the difference θ in phase between the rising edge of the input data signal 101 and the rising edge of the output 105 of the ½ frequency-divider 12 becomes less than T/4 (θ<T/4), and the existence probability of the high level "H" in the phase comparison result output 107 becomes smaller than that of the low level "L" in the phase comparison result output 107. Accordingly, the mean value voltage obtained by smoothing the phase comparison result output 107 (or 106) by a loop filter included in the loop filter and voltage comparator decreases. Therefore, the output of the loop filter and voltage comparator 9 controls the voltage controlled oscillator 11 so that the oscillation frequency of the voltage controlled oscillator 11 is dropped, so that the phase difference θ is returned to T/4.

To the contrary, if the input data signal 101 becomes fast as shown in FIG. 7, the difference θ in phase between the rising edge of the input data signal 101 and the rising edge of the output 105 of the ½ frequency-divider 12 becomes larger than T/4 (θ>T/4), and the existence probability of the high level "H" in the phase comparison result output 107 becomes larger than that of the low level "L" in the phase comparison result output 107. Accordingly, the mean value voltage obtained by smoothing the phase comparison result output 107 (or 106) by a loop filter included in the loop filter and voltage comparator increases. Therefore, the output of the loop filter and voltage comparator 9 controls the voltage controlled oscillator 11 so that the oscillation frequency of the voltage controlled oscillator 11 is elevated, so that the phase difference θ is returned to T/4.

As will be apparent from the above, the phase of the signal 105 applied to the exclusive-OR circuit 5 from the ½ frequency divider 12 is always maintained to be delayed from the (rising) edge of the input data signal by T/4. This signal 105 is supplied to the data input of the D-type flipflop 13 which receives the oscillation output 104 of the voltage controlled oscillator 11 as the data latch clock. Accordingly, the signal 105 is further delayed in phase by T/4, so that it is outputted as the bit clock 109.

This bit clock 109 is also supplied to the data latch clock input of the D-type flipflop 15, which receives the input data signal 101 at its data input. Accordingly, the input data signal 101 is latched in the D-type flipflop 15 at the center in time of the minimum pulse width T. As a result, the data output signal 110 is outputted.

As will be apparent from the above description, it is possible to realize a highly precise and small bit clock regeneration circuit suitable to be implemented on a LSI chip, without using the T/2 pulse generator including an expensive external delay circuit.

In addition, since the duty ratio of the oscillation output of the voltage controlled oscillator can be accurately made to 50%, it is possible to precisely set the timing for regenerating the bit clock. Accordingly, the input data signal can be latched in the D-type flipflop at the center in time of the minimum pulse width of the input data signal.

The invention has thus been shown and described with reference to the specific embodiments. However, it should be noted that the present invention is in no way limited to the details of the illustrated structures but changes and modifications may be made within the scope of the appended claims.

I claim:

1. A bit clock regeneration circuit comprising:

time constant adjusting means for outputting a time constant adjusting signal;

a T/2 pulse generator receiving an input pulse code modulation (PCM) data signal having a minimum pulse width T, for generating a T/2 pulse signal having a pulse width corresponding to one half of the minimum pulse width T, the T/2 pulse generator including an edge-triggered flipflop circuit for receiving and responding to the input PCM data signal for outputting a pulse signal having its pulse width adjusted by said time constant adjusting signal output by said time constant adjusting means;

a voltage-controlled oscillator having a reference oscillation frequency corresponding to 2/T, and controlled by a frequency control signal so as to change its oscillation frequency based on a voltage of the frequency control signal;

a ½ frequency divider receiving an output of the voltage-controlled oscillator, for generating a frequency-divided signal having its frequency one half of the oscillation frequency of the voltage-controlled oscillator;

a phase comparator receiving the T/2 pulse signal and the frequency-divided signal, for generating a phase comparison pulse signal indicative of a phase difference between the T/2 pulse signal and the frequency-divided signal;

filter and comparison means receiving the phase comparison pulse signal, for generating a mean voltage indicative of the phase difference between the T/2 pulse signal and the frequency-divided signal, and comparing the mean voltage with a reference voltage so as to generate a voltage different signal as the frequency control signal to the voltage-controlled oscillator;

first latch means for latching the frequency-divided signal in response to the output of the voltage-controlled oscillator so as to generate a bit clock that is delayed from the frequency-divided signal by T/4; and second latch means for latching the input PCM data signal in response to the bit clock so as to generate a data signal.

2. A bit clock generation circuit claimed in claim 1 wherein the edge-triggered flipflop circuit includes:

monostable means triggered by an edge of the input PCM data signal and controlled by the time constant adjusting signal output by said time constant adjusting means so as to generate a pulse signal having its pulse width adjusted in accordance with the time constant adjusting signal, and third latch means for latching the input PCM data signal in response to the pulse signal generated by the monostable means, and for generating a delayed data signal delayed from the input PCM data signal by T/2 wherein said T/2 pulse generator further comprises exclusive-OR means receiving the input PCM data signal and the delayed data signal for generating the T/2 pulse signal.

3. A bit clock generation circuit claimed in claim 2 wherein the phase comparator comprises an exclusive-OR circuit, and the first latch means and said second latch means each comprises a D-type flipflop.

4. A bit clock regeneration circuit according to claim 2, wherein the phase comparison pulse signal of the phase comparator is connected through a first resistor to a node.

5. A bit clock regeneration circuit according to claim 4, wherein an output of the ½ frequency divider is connected through an inverter and a second resistor to the node.

6. A bit clock regeneration circuit according to claim 5, wherein the node is connected to the filter and comparison means.

7. A bit clock regeneration circuit according to claim 1, wherein said flipflop circuit directly receives the input PCM data signal.

8. A bit clock generation circuit comprising:

time constant adjusting means for outputting a time constant adjusting signal;

a T/2 pulse generator receiving an input pulse code modulation (PCM) data signal having a minimum pulse width T, for generating a T/2 pulse signal having a pulse width corresponding to one half of the minimum pulse width T, the T/2 pulse generator including an edge-triggered flipflop circuit responding to the input PCM data signal for outputting a pulse signal having its pulse width adjusted by said time constant adjusting signal output by said time constant adjusting means;

a voltage-controlled oscillator having a reference oscillation frequency corresponding to 2/T, and controlled by a frequency control signal so as to change its oscillation frequency based on a voltage of the frequency control signal;

a ½ frequency divider receiving an output of the voltage-controlled oscillator, for generating a frequency-divided signal having its frequency one half of the oscillation frequency of the voltage-controlled oscillator;

a phase comparator receiving the T/2 pulse signal and the frequency-divided signal, for generating a phase comparison pulse signal indicative of a phase difference between the T/2 pulse signal and the frequency-divided signal;

filter and comparison means receiving the phase comparison pulse signal, for generating a mean voltage indicative of the phase difference between the T/2 pulse signal and the frequency-divided signal, and comparing the mean voltage with a reference voltage so as to generate a voltage different signal as the frequency control signal to the voltage-controlled oscillator;

first latch means for latching the frequency-divided signal in response to the output of the voltage-controlled oscillator so as to generate a bit clock that is delayed from the frequency-divided signal by T/4; and second latch means for latching the input PCM data signal in response to the bit clock so as to generate a data signal, wherein the edge-triggered flipflop circuit includes:

monostable means triggered by an edge of the input PCM data signal and controlled by the time constant adjusting signal output by said time constant adjusting means so as to generate a pulse signal having its pulse width adjusted in accordance with the time constant adjusting signal, and third latch means for latching the input PCM data signal in response to the pulse signal generated by the monostable means, and for generating a delayed data signal delayed from the input PCM data signal by T/2, wherein said T/2 pulse generator further comprises exclusive-OR means receiving the input PCM data signal and the delayed data signal for generating the T/2 pulse signal, wherein the phase comparison pulse signal of the phase comparator is connected through a first resistor to a node, and an output of the ½ frequency divider is connected through an inverter and a second resistor to the node, so that the output of the ½ frequency divider is cancelled from the phase comparison pulse signal, the node being connected to the filter and comparison means.

* * * * *